United States Patent [19]

Pearce et al.

[11] Patent Number: 5,468,591
[45] Date of Patent: Nov. 21, 1995

[54] BARRIER LAYER FOR LASER ABLATIVE IMAGING

[75] Inventors: Glenn T. Pearce, Fairport; Richard P. Henzel, Webster, both of N.Y.

[73] Assignee: Eastman Kodak Company, Rochester, N.Y.

[21] Appl. No.: 259,586

[22] Filed: Jun. 14, 1994

[51] Int. Cl.$^6$ .................................................. G03C 5/16
[52] U.S. Cl. .................... 430/201; 430/269; 430/270; 430/271; 430/200; 430/945; 428/195; 428/913; 428/914; 503/227
[58] Field of Search .................................. 428/195, 913, 428/914; 503/227; 430/200, 201, 945, 269, 270, 271; 8/471

[56] References Cited

U.S. PATENT DOCUMENTS

| | | | |
|---|---|---|---|
| 4,588,674 | 5/1986 | Stewart et al. | 430/201 |
| 4,695,288 | 9/1987 | Du Charme | 430/945 |
| 4,716,144 | 12/1987 | Vanier et al. | 430/945 |
| 4,973,572 | 11/1990 | DeBoer | 503/227 |
| 5,024,990 | 6/1991 | Chapman et al. | 430/200 |
| 5,122,502 | 6/1992 | Bowman et al. | 503/227 |
| 5,171,650 | 12/1992 | Ellis et al. | 430/20 |
| 5,246,909 | 9/1993 | Thien et al. | 430/200 |
| 5,248,653 | 9/1993 | Sakata et al. | 503/227 |
| 5,330,876 | 7/1994 | Kaszczuk et al. | 430/945 |
| 5,342,821 | 8/1994 | Pearce | 503/227 |

OTHER PUBLICATIONS

U.S. application Ser. No. 99,970, filed Jul. 30, 1993, of Topel et al.

Primary Examiner—Charles L. Bowers, Jr.
Assistant Examiner—M. J. Angebranndt
Attorney, Agent, or Firm—Harold E. Cole

[57] ABSTRACT

An ablative recording element comprising a support having thereon, in order, a barrier layer and a colorant layer comprising a colorant dispersed in a polymeric binder, the colorant layer having an infrared-absorbing material associated therewith, and wherein the barrier layer comprises a vinyl polymer having recurring units of the following formula:

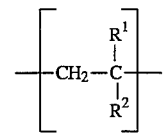

wherein
$R^1$ and $R^2$ each independently represents a halogen atom; a haloalkyl group with at least one halogen atom in its β-position of the carbon to which $R^1$ or $R^2$ is attached; a ketal group; an acetal group; a thioketal group; a thioacetal group; a substituted or unsubstituted alkyl group; or a group containing a double or triple bond between any two atoms, one of which is adjacent to the carbon to which $R^1$ or $R^2$ is attached;

with the proviso that at least one of $R^1$ and $R^2$ represents a group containing a double or triple bond between any two atoms, one of which is adjacent to the carbon to which $R^1$ or $R^2$ is attached; or $R^1$ and $R^2$ may be joined together to form a ring.

18 Claims, No Drawings

BARRIER LAYER FOR LASER ABLATIVE IMAGING

This invention relates to the use of a barrier layer in a laser ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off substantially all of the image dye and binder at the spot where the laser beam hits the element. In ablative imaging, the laser radiation causes rapid local changes in the imaging layer thereby causing the material to be ejected from the layer. Ablation imaging is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density value serves as a measure of the completeness of image dye removal by the laser.

U.S. Pat. No. 4,973,572 relates to infrared-absorbing cyanine dyes used in laser-induced thermal dye transfer elements. In Example 3 of that patent, a positive image is obtained in the dye element by using an air stream to remove sublimed dye. However, there is no disclosure of the use of a barrier layer in the element in this process.

U.S. Pat. No. 5,171,650 relates to an ablation-transfer image recording process. In that process, an element is employed which contains a dynamic release layer which absorbs imaging radiation which in turn is overcoated with an ablative carrier topcoat. Examples of the dynamic release layer include thin films and organic monomers and polymers. An image is transferred to a receiver in contiguous registration therewith. However, there is no disclosure in that patent that the element should contain a hydrophobic barrier layer as disclosed herein.

Copending U.S. Ser. No. 08/321,282, filed Oct. 11, 1974, of Topel et al. relates to the use of hydrophilic barrier layers in dye ablative recording elements. While these barrier layers have proven useful in reducing Dmin, a problem has developed with these materials in that they do not provide sufficient adhesion when the film elements are subjected to casual water contact such as film cleaners, condensation, high humidity, spillage of beverages, food, etc. It is therefore an object of this invention to provide a hydrophobic interlayer which is water-resistant in addition to improving the Dmin or dye cleanout.

It is an object of this invention to provide an ablative recording element having an improved Dmin. It is another object of this invention to provide a single-sheet process which does not require a separate receiving element. It is still another object of this invention to provide a barrier layer for an ablative recording element which will be water resistant.

These and other objects are achieved in accordance with the invention which comprises an ablative recording element comprising a support having thereon, in order, a barrier layer and a colorant layer comprising a colorant dispersed in a polymeric binder, the colorant layer having an infrared-absorbing material associated therewith, and wherein the barrier layer comprises a vinyl polymer having recurring units of the following formula:

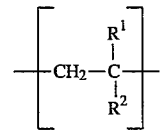

wherein:
$R^1$ and $R^2$ each independently represents a halogen atom; a haloalkyl group with at least one halogen atom in its β-position of the carbon to which $R^1$ or $R^2$ is attached; a ketal group; an acetal group; a thioketal group; a thioacetal group; a substituted or unsubstituted alkyl group; or a group containing a double or triple bond between any two atoms, one of which is adjacent to the carbon to which $R^1$ or $R^2$ is attached, such as cyano, carbonyl, isocyanate, azide, sulfonyl, nitro, phosphoric, phosphonyl, acetylenic, ethylenic, substituted or unsubstituted aryl or heteroaryl;

with the proviso that at least one of $R^1$ and $R^2$ represents a group containing a double or triple bond between any two atoms, one of which is adjacent to the carbon to which $R^1$ or $R^2$ is attached; or $R^1$ and $R^2$ may be joined together to form a ring, such as itaconic anhydride.

In a preferred embodiment of the invention, $R^1$ and $R^2$ each independently represents

where X is O, S, NR, or $N(R)_2^+$; $R^3$ is R, OR, $O^-M^+$, OCOOR, SR, NHCOR, $NHCON(R)_2$, $N(R)_2$, $N(R)_3^+$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

In a preferred embodiment of the invention, the vinyl polymer has repeating units derived from alkyl 2-cyanoacrylates or amides, or methylene diacrylates or diamides. In another preferred embodiment, the vinyl polymer is a poly(alkyl cyanoacrylate) such as methyl-, ethyl-, propyl-, butyl-, 2-ethylhexyl-, or ethylmethoxy 2-cyanoacrylate.

The molecular weights of the vinyl polymers described above may be between 1,000 and 1,000,000 weight average molecular weight. Particularly good results have been obtained with polymers having a molecular weight between 2,000 and 500,000 weight average (polystyrene equivalent by size exclusion chromatography).

The vinyl polymers described above may also be copolymerized with other monomers. For example, the vinyl polymer may comprise copolymers of at least 50 wt.%, preferably more than 75 wt.%, of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Examples of vinyl polymers useful in the invention include the following:

| Compound | $R^1$ | $-[CH_2-\underset{\underset{R^2}{|}}{\overset{\overset{R^1}{|}}{C}}]-R^2$ |
|---|---|---|
| 1 (PCyA-1) | $-C\equiv N$ | $-COOCH_3$ |
| 2 (PCyA-3) | $-C\equiv N$ | $-COOC_2H_5$ |
| 3 | $-C\equiv N$ | $-COOC_3H_7$ |
| 4 | $-C\equiv N$ | $-COOC_4H_9$ |
| 5 | $-C\equiv N$ | $-COOH$ |
| 6 | $-C\equiv N$ | $-C\equiv N$ |
| 7 | $-C\equiv N$ | $-COOCH_2CH(CH_2CH_3)C_4H_9$ |
| 8 | $-C\equiv N$ | $-COOCH_2CH_2OCH_3$ |
| 9 | $-C\equiv N$ | $-Cl$ |
| 10 | $-C\equiv N$ | $-CONHCH_3$ |
| 11 | $-C\equiv N$ | $-CON(CH_3)_2$ |
| 12 | $-COOCH_3$ | $-COOCH_3$ |
| 13 | $-CONHCH_3$ | $-CONHCH_3$ |
| 14 | $-C\equiv N$ | $(-COOCH_3)_{70}(-COOC_2H_5)_{30}$ |
| 15 (PCyA-2) | $-Cl$ | $-COOCH_3$ |

Another embodiment of the invention relates to a process of forming a single color, ablation image having an improved Dmin comprising imagewise heating by means of a laser, an ablative recording element comprising a support having thereon, in order, a barrier layer and a colorant layer comprising a colorant dispersed in a polymeric binder, the colorant layer having an infrared-absorbing material associated therewith, the laser exposure taking place through the colorant side of the element, and removing the ablated material, such as by means of an air stream, to obtain an image in the ablative recording element, and wherein the barrier layer comprises the vinyl polymer as described above.

It has been found unexpectedly that use of a vinyl polymer barrier layer in the above ablative recording element for laser ablative imaging significantly affects the desired cleanout as evidenced by the resulting faster writing speeds to achieve a given minimum density. Minimum densities of less than 0.10 are achieved in accordance with the invention. In addition, these barrier layers are water-resistant, as will be shown hereinafter.

The vinyl polymer barrier layers of this invention are useful with imaging layers which contain any type of colorant such as visible or infrared dyes, ultraviolet dyes, pigments, etc.

The vinyl polymer barrier layers of this invention may also include materials that absorb laser light, such as carbon black or infrared-absorbing dyes, such as those dyes described in U.S. Pat. No. 5,387,496, the disclosure of which is hereby incorporated by reference. Further Dmin reductions are observed when infrared-absorbing materials are present. The infrared-absorbing materials can be present in the barrier layer at between 2 and 75 wt-%, relative to the vinyl polymer barrier layer, and preferably between 10 and 50 wt-%.

While any coverage of barrier layer may be employed which is effective for the intended purpose, good results have been obtained at coverages of from about 0.05 to about 1.0 $g/m^2$, preferably 0.1 to about 0.5 $g/m^2$.

The ablation elements of this invention can be used to obtain medical images, reprographic masks, printing masks, etc. The image obtained can be a positive or a negative image.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

The reduction in Dmin obtained with this invention is important for graphic arts applications where the Dmin/Dmax of the mask controls the exposure latitude for subsequent use. This also improves the neutrality of the Dmin for medical imaging applications. The dye removal process can be by either continuous (photographic-like) or halftone imaging methods.

The lower Dmin values achieved in accordance with the invention greatly expand the UV contrast of these ablative film elements, which enhances their usefulness when exposing UV-sensitive printing plates with UV radiation.

Any polymeric material may be used as the binder in the recording element employed in the process of the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); poly(vinyl halides) such as poly(vinyl chloride) and poly(vinyl chloride) copolymers; poly(vinyl ethers); maleic anhydride copolymers; polystyrene; poly(styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 $g/m^2$.

In a preferred embodiment, the polymeric binder used in the recording element employed in process of the invention has a polystyrene equivalent molecular weight of at least 100,000 as measured by size exclusion chromatography, as described in U.S. Pat. No. 5,330,876.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat a ablative recording element, the element must contain an infrared-absorbing material, such as pigments like carbon black, or cyanine infrared-absorbing dyes as described in U.S. Pat. No. 4,973,572, or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the colorant layer and converted to heat by a molecular process known as internal conversion. Thus, the construction of a useful colorant layer will depend not only on the hue, transferability and intensity of the colorant, but also on the ability of the colorant layer to absorb the radiation and convert it to heat. The infrared-absorbing material or dye may be contained in the colorant layer itself or in a separate layer associated therewith, i.e., above or below the colorant layer. As noted above, the laser exposure in the process of the invention takes place through the colorant side of the ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any dye can be used in the ablative recording element employed in the invention provided it can be ablated by the action of the laser. Especially good results have been obtained with dyes such as anthraquinone dyes, e.g., Sumikaron Violet RS® (product of Sumitomo Chemical Co., Ltd.), Dianix Fast Violet 3RFS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

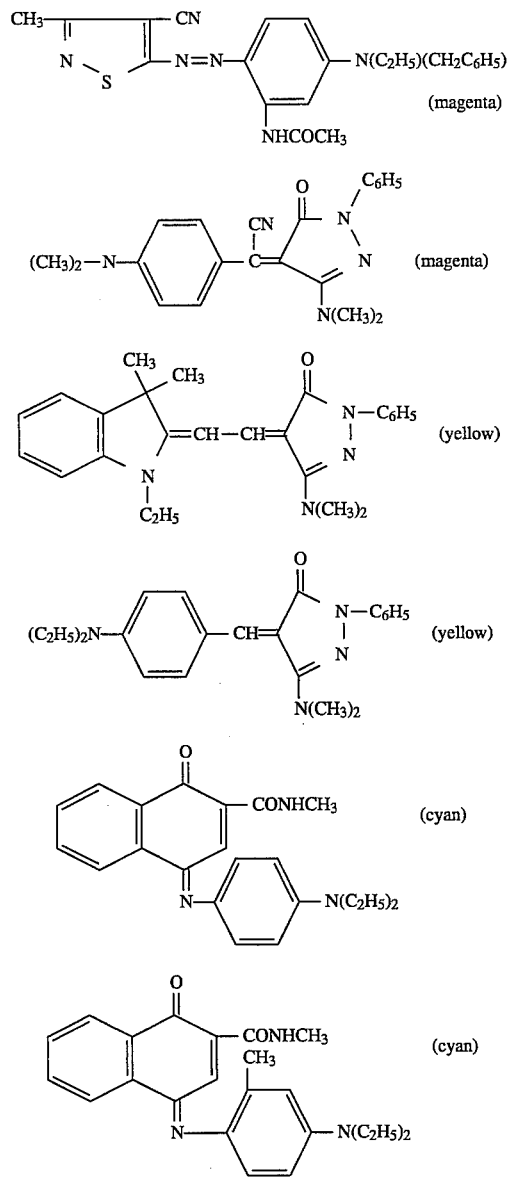

or any of the dyes disclosed in U.S. Pat. No. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 $g/m^2$ and are preferably hydrophobic.

Pigments which may be used in the colorant layer of the ablative recording layer of the invention include carbon black, graphite, metal phthalocyanines, etc. When a pigment is used in the colorant layer, it may also function as the infrared-absorbing material, so that a separate infrared-absorbing material does not have to be used.

The colorant layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly-(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

Ablative recording Elements 1–7 were prepared to compare Dmin and water resistance with and without the presence of barrier layers of this invention, and with hydrophilic barrier layers as a comparison. The image dye layer for these elements contained a mixture of visible and UV dyes and is particularly useful for producing UV masks for imagewise exposing printing plates, printed circuit boards, and the like. All the elements in this example were coated on 100 μm thick poly-(ethylene terephthalate) support.

Element 1 (control—without barrier interlayer)

The image dye was coated from a methyl isobutyl ketone/ethanol 8:2 solvent mixture at a wet laydown of 32 cc/m² and contained the following dissolved ingredients at the indicated aim dry coverages:

Nitrocellulose (1000–15000 cps) (Aqualon Co.) @0.60 g/m²

Cyan dye@0.16 g/m²

Yellow dye@0.28 g/m²

Magenta dye@0.11 g/m²

UV dye@0.13 g/m²

IR dye 2@0.22 g/m²

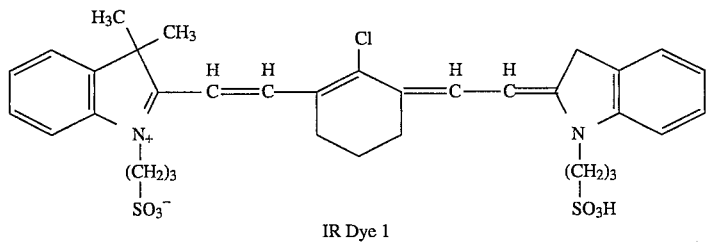

IR Dye 1

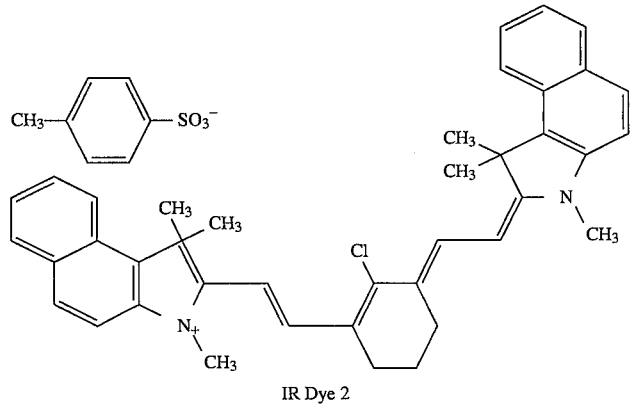

IR Dye 2

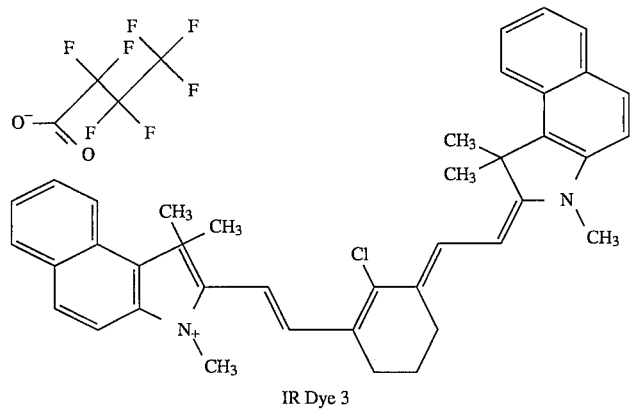

IR Dye 3

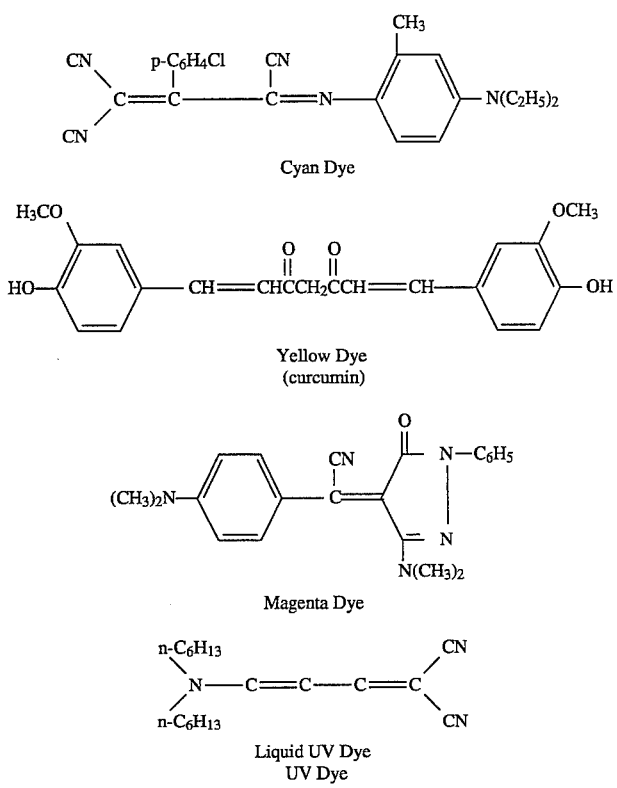

Element 2 (Comparative Barrier Layer)

A barrier interlayer was coated on the support from water at a wet laydown of 16 cc/m² to deliver the following ingredients at the indicated aim dry coverages: 0.05 g/m² gelatin, 0.05 g/m² IR Dye 1, and 0,006 g/m² 10G surfactant (Olin Corp.).

Element 3 (Comparative Barrier Layer)

A barrier interlayer was coated from water to deliver 0.22 g/m² poly (vinyl alcohol) (99% hydrolyzed) (PVA).

Element 4 (Comparative Barrier Layer)

A barrier interlayer was coated from water to deliver the following ingredients at the indicated aim dry coverages: 0.22 g/m² PVA, 0,022 g/m² Tyzor® TE bis[[2,2',2"-nitrilotris[ethanolato]](1-)-N,O]bis(2-propanolato)titanium (DuPont Corp.) crosslinking agent, and 0.05 g/m² IR Dye 1.

Element 5 (Invention Barrier Layer)

A barrier interlayer was coated from acetonitrile to deliver the following ingredients at the indicated aim dry coverages: 0.38 g/m² PCyA-1, poly(methyl 2-cyanoacrylate), 0.05 g/m² IR Dye 2, and 0,003 g/m² surfactant FC-431® (3M Corp.).

Element 6 (Invention Barrier Layer)

A barrier interlayer was coated from acetonitrile to deliver the following ingredients at the indicated aim dry coverages: 0.38 g/m² PCyA-2, a 70/30 weight ratio copolymer of methyl 2-cyanoacrylate and ethyl 2-cyanoacrylate, 0.05 g/m² IR Dye 2, and 0,003 g/m² surfactant FC-431® (3M Corp.).

Element 7 (Invention Barrier Layer)

A barrier interlayer was coated from 2-butanone to deliver the following ingredients at the indicated aim dry coverages: 0.38 g/m² PCyA-3, poly(ethyl 2-cyanoacrylate), 0.05 g/m² IR Dye 2, and 0,002 g/m² surfactant DC 1248 (Dow Corning Corp.).

Elements 2–7 were all overcoated with the same image dye layer of Element 1 with the exception of Elements 3 and 4, which contained 0.22 g/m² instead of 0.16 g/m² cyan dye and also contained 0.11 g/m² Cyasorb® UV 24 light stabilizer (American Cyanamid Co.). The image dye layer of Element 7 was coated from a 50/50 mixture of butyl acetate and isobutanol in order not to dissolve or disrupt the barrier interlayer.

The recording elements were imaged with a diode laser imaging device as described in U.S. Pat. No. 5,387,496, referred to above. The laser beam had a wavelength range of 800–830 nm and a nominal power output of 200 mWatts at the end of the optical fiber. Table 1 lists the UV transmission Dmins recorded on an X-Rite® densitometer Model 310 (X-Rite Co.) obtained on a Dmin patch recorded at a drum speed of 200 rev/min. The UV density of the elements before imaging was in the range of 3.5 to 3.7 for all film elements.

Table 1 also lists the results of a water resistance test that involved vigorously rubbing a test image (a halftone image containing pictorial and text regions) with a water-soaked cotton pad. A failure was indicated if any portion of the image dye regions were removed with 40 or fewer rubs. The gelatin barrier layer (Element 2) typically failed after 3 or 4 rubs.

TABLE 1

| Element | Barrier Layer Polymer (g/m²) | IR DYE (g/m²) | UV Dmin | Water Resist. |
|---|---|---|---|---|
| 1 (Control) | None | None | 0.30 | Pass |
| 2 (Comparison) | Gelatin (0.05) | 1 (0.05) | 0.15 | Fail |
| 3 (Comparison) | PVA (0.22) | None | 0.23 | Fail |

TABLE 1-continued

| Element | Barrier Layer Polymer (g/m²) | IR DYE (g/m²) | UV Dmin | Water Resist. |
|---|---|---|---|---|
| 4 (Comparison) | PVA* (0.22) | 1 (0.05) | 0.14 | Fail |
| 5 (Invention) | PCyA-1 (0.38) | 2 (0.05) | 0.11 | Pass |
| 6 (Invention) | PCyA-2 (0.38) | 2 (0.05) | 0.11 | Pass |
| 7 (Invention) | PCyA-3 (0.38) | 2 (0.05) | 0.08 | Pass |

*Coating contains 10% by weight Tyzor TE ® (DuPont Corp.) as crosslinking agent.

The data of Table 1 indicate that the barrier interlayers of this invention provide large reductions in Dmin compared to elements with no barrier interlayer, and significant reductions in Dmin compared to elements with hydrophilic barrier layers. In addition, the interlayers of the invention also provide excellent resistance to casual water exposure.

EXAMPLE 2

Film elements were prepared containing an image dye layer coated over a cyanoacrylate barrier layer of the invention at various layer thicknesses and various IR Dye-to-polymer ratios.

All Elements 8–17 listed in Table 2 were coated on 100 µm thick poly(ethylene terephthalate) support which had been subjected to a corona discharge treatment. The cyanoacrylate barrier layers were all coated from acetonitrile with surfactant FC-431® (0.003 g/m²) as a coating aid, and the total layer dry laydowns are listed in Table 2, along with the polymer/IR Dye ratios.

The barrier layers of elements 8–17 were all subsequently overcoated with the image dye layer of Element 1. The resulting ablative recording films were then imaged as described in Example 1, and the UV transmission densities recorded on a Dmin patch at 200 rev/min drum speed are listed as follows:

TABLE 2

| Element | Total Laydown (g/m²) Polymer + IR Dye | Polymer/ IR Dye Ratio | IR Dye | UV Dmin |
|---|---|---|---|---|
| 1 | Control | — | none | 0.3 |
| 8 | 0.11 | 1/1 | IR-2 | 0.27 |
| 9 | 0.13 | 4/1 | IR-2 | 0.18 |
| 10 | 0.13 | 8/1 | IR-2 | 0.19 |
| 11 | 0.27 | 4/1 | IR-2 | 0.14 |
| 12 | 0.27 | 8/1 | IR-2 | 0.13 |
| 13 | 0.43 | 1/1 | IR-2 | 0.22 |
| 14 | 0.43 | 4/1 | IR-2 | 0.13 |
| 15 | 0.43 | 8/1 | IR-2 | 0.11 |
| 16 | 0.22 | — | none | 0.21 |
| 17 | 0.27 | 4/1 | IR-3 | 0.16 |

The above data indicate that all barrier layer elements according to the invention provide Dmin reduction. The data also show that laydown amounts of 0.2 g/m² or greater along with polymer/IR ratios of 4/1 to 8/1 provide the best results.

EXAMPLE 3

On a 100 µm thick poly(ethylene terephthalate) support having a corona discharge treatment was coated the cyanoacrylate barrier interlayer of Element 6. This was subsequently overcoated with various image dye layers, to form ablative film Elements 18 through 27 as listed in Table 3. All of the Elements 18 through 27 contained the same dyes of Element 1, but containing different binder polymers as follows:

| B-1 | nitrocellulose (100 . 1500 cps) (Aqualon, Inc.) |
|---|---|
| B-2 | poly(ethyl 2-cyanoacrylate); same as PCya-3 of Element 7 |
| B-3 | ethyl cellulose HE-35OH (Hercules) |
| B-4 | styrene/butyl methacrylate Copolymer # 595 (Scientific Polymer Products, Inc.) |
| B-5 | vinyl chloride/vinyl acetate/vinyl alcohol Terpolymer # 428 (Scientific Polymer products, Inc.) |
| B-6 | poly(4-tert-butyloxycarbonyloxy-styrene) |
| B-7 | poly(methyl methacrylate) (Eastman Kodak Company) |
| B-8 | poly(α-methylstyrene) # 399 (Scientific Polymer Products, Inc.) |
| B-9 | Makrolon ® M-5705 polycarbonate (Miles Labs.) |
| B-10 | PAC-40 polycarbonate (Air Products, Inc.) |

The image dye layers were coated from an 8:2 mixture of methyl isobutyl ketone and ethanol, except for Element 19, which was coated from 2-butanone, and Element 26, which was coated from methylene chloride. A corresponding control sample was coated for each of film Elements 18–27 on the bare support without barrier layer, for comparison purposes.

The recording elements were imaged with a diode laser imaging device, similar to that used in Examples 1 and 2, except that the drum circumference was 70.4 cm, and the imaging electronics were activated to provide 1,108 mJ/cm² exposure at a drum rotation of 400 rev/min. The translation stage was incrementally advanced across the ablative-dye element by means of a lead screw turned by a microstepping motor to give a center-to-center line distance of 10 µm (945 lines per centimeter or 2400 lines per inch). A vacuum-powered air stream was blown over the donor surface to remove sublimed dye. The measured total power at the focal plane was 500 mWatt. Table 3 lists the UV transmission Dmin values recorded with an X-Rite Densitometer® Model 310 (X-Rite Corp.) obtained on a Dmin patch recorded at a drum rotation of 400 rev/min. The UV density of the elements before imaging was in the range of 3.0 to 3.7 for all film elements. The following results were obtained:

TABLE 3

| | | UV Dmin | |
|---|---|---|---|
| Element | Image Layer Binder | Barrier Interlayer | No Barrier Interlayer (Controls) |
| 18 | B-1 | 0.06 | 0.17 |
| 19 | B-2 | 0.06 | 0.16 |
| 20 | B-3 | 0.14 | 1.08 |
| 21 | B-4 | 0.25 | 1.03 |
| 22 | B-5 | 0.06 | 0.60 |
| 23 | B-6 | 0.06 | 0.31 |
| 24 | B-7 | 0.21 | 0.73 |
| 25 | B-8 | 0.06 | 0.28 |
| 26 | B-9 | 0.07 | 1.34 |
| 27 | B-10 | 0.09 | 1.16 |

The above data illustrates the utility of the barrier layers of this invention by demonstrating that, regardless of the binder polymer used in the image dye layer, the Dmin values are consistently lower when a barrier layer of the invention is present between the support and the image dye layer.

EXAMPLE 4

On a 100 μm thick poly(ethylene terephthalate) support having a corona discharge treatment was coated the cyanoacrylate barrier interlayer of Element 6. This was subsequently overcoated with an ablative image layer comprising 0.52 g/m² of Regal 300® carbon black (Cabot Corp.) and 0.52 g/m² of nitrocellulose coated from 2-butanone to form ablative film Element 28 as listed in Table 4. The same image layer was coated over a bare support to serve as a control with no barrier layer.

The elements were processed as in Example 3 except that the drum circumference was 52.9 cm, and the imaging electronics were activated to provide 804 mJ/cm² exposure at a drum rotation of 800 rev/min. The following results were obtained:

TABLE 4

| Element | Image Layer Colorant | UV Dmin Barrier Interlayer | No Barrier Interlayer (Control) |
|---|---|---|---|
| 28 | carbon black | 0.05 | 0.21 |

The above data illustrates that the barrier layer of this invention is also useful in elements containing pigments as the colorant.

The invention has been described in detail with particular reference to preferred embodiments thereof, but it will be understood that variations and modifications can be effected within the spirit and scope of the invention.

What is claimed is:

1. An ablative recording element comprising a support having thereon, in order, a barrier layer and a colorant layer comprising a colorant dispersed in a polymeric binder, said colorant layer having an infrared-absorbing material associated therewith, and wherein said barrier layer comprises a hydrophobic vinyl polymer having recurring units of the following formula:

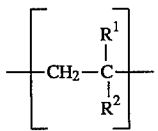

wherein:

$R^1$ and $R^2$ each independently represents cyano, isocyanate, azide, sulfonyl nitro, phosphoric, phosphonyl, heteroaryl, or

where
X is O, S, NR, or $N^+(R)_2$;
$R^3$ is R, OR, O$^-$M$^+$, OCOOR, SR, NHCOR, NHCON(R)$_2$, N(R)$_2$ or $N^+(R)_3$;
M$^+$ is an alkali or ammonium moiety; and
R is hydrogen, halogen, or an alkyl or cycloalkyl group.

2. The element of claim 1 wherein said vinyl polymer is a poly(alkyl cyanoacrylate).

3. The element of claim 2 wherein said poly(alkyl cyanoacrylate) is poly(methyl 2-cyanoacrylate) or poly(ethyl 2-cyanoacrylate).

4. The element of claim 1 wherein said barrier layer is present at a concentration of from about 0.05 to about 1.0 g/m².

5. The element of claim 1 wherein said barrier layer also contains an infrared-absorbing dye.

6. The element of claim 1 wherein said infrared-absorbing material is a dye which is contained in said colorant layer.

7. The element of claim 1 wherein said support is transparent.

8. The element of claim 1 wherein said colorant is a dye.

9. The element of claim 1 wherein said colorant is a pigment which also functions as said infrared-absorbing material.

10. A process of forming a single color, ablation image having an improved Dmin comprising imagewise heating by means of a laser, an ablative recording element comprising a support having thereon, in order, a barrier layer and a colorant layer comprising a colorant dispersed in a polymeric binder, said colorant layer having an infrared-absorbing material associated therewith, said laser exposure taking place through the colorant side of said element, and removing the ablated colorant to obtain said image in said ablative recording element, wherein said barrier layer comprises a hydrophobic vinyl polymer having recurring units of the following formula:

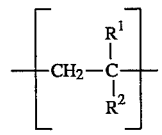

wherein:

$R^1$ and $R^2$ each independently represents cyano, isocyanate, azide, sulfonyl, nitro, phosphoric, phosphonyl, heteroaryl, or

where
X is O, S, NR, or $N^+(R)_2$;
$R^3$ is R, OR, O$^-$M$^+$, OCOOR SR NHCOR NHCON(R)$_2$, N(R)$_2$ or $N^+(R)_3$;
M$^+$ is an alkali or ammonium moiety; and
R is hydrogen, halogen, or an alkyl or cycloalkyl group.

11. The process of claim 10 wherein said vinyl polymer is a poly(alkyl cyanoacrylate).

12. The process of claim 11 wherein said poly(alkyl cyanoacrylate) is poly(methyl 2-cyanoacrylate) or poly(ethyl 2-cyanoacrylate).

13. The process of claim 10 wherein said barrier layer is present at a concentration of from about 0.05 to about 1.0 g/m².

14. The process of claim 10 wherein said barrier layer also contains an infrared-absorbing dye.

15. The process of claim 10 wherein said infrared-absorbing material is a dye which is contained in said colorant layer.

16. The process of claim 10 wherein said support is transparent.

17. The process of claim 10 wherein said colorant is a dye.

18. The process of claim 10 wherein said colorant is a pigment which also functions as said infrared-absorbing material.

* * * * *